United States Patent
Haertl et al.

(10) Patent No.: US 10,424,636 B2
(45) Date of Patent: Sep. 24, 2019

(54) POWER SEMICONDUCTOR DEVICES, SEMICONDUCTOR DEVICES AND A METHOD FOR ADJUSTING A NUMBER OF CHARGE CARRIERS

(71) Applicant: Infineon Technologies AG, Neubiberg (DE)

(72) Inventors: Andreas Haertl, Ottobrunn (DE); Martin Brandt, Garching (DE); Andre Rainer Stegner, Munich (DE); Martin Stutzmann, Erding (DE)

(73) Assignee: Infineon Technologies AG (DE)

( * ) Notice: Subject to any disclaimer, the term of this patent is extended or adjusted under 35 U.S.C. 154(b) by 78 days.

(21) Appl. No.: 15/386,077

(22) Filed: Dec. 21, 2016

(65) Prior Publication Data
US 2017/0179224 A1    Jun. 22, 2017

(30) Foreign Application Priority Data

Dec. 21, 2015 (DE) .................. 10 2015 122 387

(51) Int. Cl.
*H01L 29/06* (2006.01)
*H01L 29/40* (2006.01)
(Continued)

(52) U.S. Cl.
CPC ...... *H01L 29/0626* (2013.01); *H01L 29/0649* (2013.01); *H01L 29/0684* (2013.01);
(Continued)

(58) Field of Classification Search
None
See application file for complete search history.

(56) References Cited

U.S. PATENT DOCUMENTS

| 8,736,029 B2 * | 5/2014 | Sato | ............... H01L 29/404 257/632 |
| 2005/0253170 A1 * | 11/2005 | Akiyama | ......... H01L 21/76251 257/211 |

(Continued)

FOREIGN PATENT DOCUMENTS

| JP | 2006-080368 A | 3/2006 |
| JP | 2008-177469 A | 7/2008 |

(Continued)

OTHER PUBLICATIONS

Pfaffenlehner, M., E. Falck, F.-J. Niedernostheide, H.-J. Schulze, and G. Schmidt, "Switching Ruggedness of High-Power Diodes", EPE 2005—Dresden, pp. 1-8. ISBN: 90-75815-08-5.

(Continued)

*Primary Examiner* — Daniel Whalen
(74) *Attorney, Agent, or Firm* — Design IP

(57) ABSTRACT

A power semiconductor device includes a semiconductor substrate including at least one electrical structure. The at least one electrical structure has a blocking voltage of more than 20V. Further, the power semiconductor device includes an electrically insulating layer structure formed over at least a portion of a lateral surface of the semiconductor substrate. The electrically insulating layer structure embeds one or more local regions for storing charge carriers. Further, the one or more local regions includes in at least one direction a dimension of less than 200 nm.

18 Claims, 8 Drawing Sheets

(51) Int. Cl.
*H01L 29/739* (2006.01)
*H01L 29/861* (2006.01)
*H01L 29/78* (2006.01)
*H01L 29/417* (2006.01)

(52) U.S. Cl.
CPC .......... *H01L 29/401* (2013.01); *H01L 29/408* (2013.01); *H01L 29/7395* (2013.01); *H01L 29/7811* (2013.01); *H01L 29/8611* (2013.01); H01L 29/402 (2013.01); H01L 29/404 (2013.01); H01L 29/407 (2013.01); H01L 29/41758 (2013.01)

(56) References Cited

U.S. PATENT DOCUMENTS

| | | | |
|---|---|---|---|
| 2008/0173969 | A1 | 7/2008 | Herbert et al. |
| 2009/0032851 | A1* | 2/2009 | Pfirsch .................. H01L 21/221 257/288 |
| 2012/0286355 | A1 | 11/2012 | Mauder et al. |
| 2013/0256747 | A1 | 10/2013 | Sin et al. |
| 2014/0061733 | A1* | 3/2014 | Schmidt ............ H01L 21/02203 257/288 |

FOREIGN PATENT DOCUMENTS

| | | |
|---|---|---|
| JP | 2013-187240 A | 9/2013 |
| WO | 2013061433 A | 5/2012 |

OTHER PUBLICATIONS

Meyer, B. K., D. M. Hofmann, W. Stadler, V. Petrova-Koch, F. Koch, P. Omling and P. Emanuelsson, "Defects in porous silicon investigated by optically detected and by electron paramagnetic resonance techniques", Applied Physics Letters 63, 2120 (1993). doi: 10.1063/1.110559.

Serincan, U., S. Yerci, M. Kulakci and R. Tuan, "Evolution of SiO2 matrix during the formation of Ge and Si nanocrystals by ion implantation", Nuclear Instruments and Methods in Physics Research B 239 (2005), pp. 419-425. doi: 10.1016/j.nimb.2005.04.120.

Suominen, T., P. Paturi, H. Huhtinen, L. Heikkila, H.-P. Hedman, R. Punkkinen and R. Laiho, "Conductivity and distribution of charge on electroluminescent Si/SiOa structures investigated by electrostatic force microscopy", Applied Surface Science 222 (2004), pp. 131-137. doi: 10.1016/kapsusc.2003.08.004.

Takagi, H., H. Ogawa, Y. Yamazaki, A. Ishizaki and T. Nakagiri, "Quantum size effects on photoluminescence in ultrafine Si particles", Applied Physics Letters 56, 2379 (1990). doi: 10.1063/1.102921.

Zacharias, M., J. Heitmann, R. Scholz and U. Kahler, "Size-controlled highly luminescent silicon nanocrystals: A SiO/SiO2 superlattice approach", Applied Physics Letters, vol. 80, No. 4 (Jan. 24, 2002), pp. 661-664. doi: 10.1063/1.1433906.

Fujii, M., Atsushi Mimura, Shinji Hayashi and Keiichi Yamamoto, "Photoluminescence from Si nanocrystals dispersed in phosphosilicate glass thin films: Improvement of photoluminescence efficiency", Applied Physics Letters 75, pp. 184-186 (1999). doi: 10.1063/1.124313.

Sharp, I. D., Q. Xu, C. Y. Liao, D. O. Yi, J. W. Beeman, Z. Liliental-Weber, K. M. Yu, D. N. Zakharov, J. W. Ager III, D. C. Chrzan and E. E. Haller, "Stable, freestanding Ge nanocrystals", Journal of Applied Physics 97 124316 (2005). doi: 10.1063/1.1942629.

Lu, T. Z., M. Alexe, R. Scholz, V. Talalaev, R. J. Zhang and M. Zacharias, "Si nanocrystal based memories: Effect of the nanocrystal density", Journal of Applied Physics 100, 0143310 (2006). doi: 10.1063/1.2214300.

Janotta, Andreas, Yavuz Dikce, Matthias Schmidt, Christopher Eisele and Martin Stutzmann, "Light-induced moditication of a-SiOx II: Laser crystallization", Journal of Applied Physics, vol. 95, No. 8 (Apr. 15, 2004), pp. 4060-4068. doi: 10.1063/1.1667008.

* cited by examiner

POWER SEMICONDUCTOR DEVICES, SEMICONDUCTOR DEVICES AND A METHOD FOR ADJUSTING A NUMBER OF CHARGE CARRIERS

FIELD

Embodiments relate to concepts for reducing or shielding electric fields at semiconductor devices and in particular to power semiconductor devices, semiconductor devices, methods for forming semiconductor devices and a method for adjusting a number of charge carriers stored by one or more local regions for storing charge carriers embedded within an electrically insulating layer structure.

BACKGROUND

Semiconductor devices have to endure electric fields occurring during operation. For example, some devices being power semiconductors (e.g., insulated-gate bipolar transistors (IGBTs) and diodes) must meet the requirement to safely block voltages of up to 6500 volt. For this purpose, edge terminations are required which decrease these high voltages in the direction of the chip edge. A part of the edges which is essential for the long-term stability of power devices are the covering layers, the so-called passivation.

SUMMARY

There may be a demand for providing a concept for semiconductor devices, which allows to improve the reliability and/or durability of semiconductor devices.

Such a demand may be satisfied by the subject matter of the claims.

One or more embodiments relate to a power semiconductor device comprising a semiconductor substrate comprising at least one electrical structure. The at least one electrical structure has a blocking voltage of more than 20V. Further, the power semiconductor device comprises an electrically insulating layer structure formed over at least a portion of a lateral surface of the semiconductor substrate. The electrically insulating layer structure embeds one or more local regions for storing charge carriers. Further, the one or more local regions comprise in at least one direction a dimension of less than 200 nm.

One or more embodiments relate to a semiconductor device comprising a semiconductor substrate and an electrically insulating layer structure formed over at least a portion of a lateral surface of the semiconductor substrate. The electrically insulating layer structure embeds a plurality of local regions for storing charge carriers. The plurality of local regions for storing charge carriers is distributed over at least a portion of the electrically insulating layer structure comprising a thickness of more than 50 nm.

One or more embodiments relate to a semiconductor device comprising a semiconductor substrate and an electrically insulating layer structure formed over at least a portion of a lateral surface of the semiconductor substrate. The electrically insulating layer structure embeds one or more local regions for storing charge carriers. A current of charge carriers from the one or more local regions for storing charge carriers to the semiconductor substrate is less than $1*10^{-17}$ A/cm$^2$ during normal operation of the semiconductor device. Further, at least a portion of the electrically insulating layer structure embeds an average amount of charge carriers per volume of more than $1*10^{-8}$ Coulomb per cm$^3$ stored by the one or more local regions for storing charge carriers.

One or more embodiments relate to a semiconductor device comprising a semiconductor substrate and an electrically insulating layer structure formed over at least a portion of a lateral surface of the semiconductor substrate. The electrically insulating layer structure embeds one or more local regions for storing charge carriers. A charge stored by the one or more local regions for storing charge carriers embedded within the electrically insulating layer structure causes an electric field of more than $1*10^5$ volts per meter at an interface between the electrically insulating layer structure and a passivation layer or between the electrically insulating layer structure and a molding material of a package of the semiconductor device in a non-operating state of the semiconductor device.

One or more embodiments relate to a semiconductor device comprising a semiconductor substrate and at least one trench extending from a surface of the semiconductor substrate into the semiconductor substrate. Further, the semiconductor device comprises an electrically insulating layer structure formed within the at least one trench. The electrically insulating layer structure embeds a plurality of local regions for storing charge carriers. A density of local regions of the plurality of local regions within at least a portion of the electrically insulating layer structure is larger than $1*10^9$ local regions per cm$^2$.

One or more embodiments relate to a method for adjusting a number of charge carriers stored by one or more local regions for storing charge carriers embedded within an electrically insulating layer structure formed over a semiconductor substrate of a semiconductor device The method comprises heating the semiconductor substrate to a temperature of more than 250° C. and generating an electric field to adjust a number of charge carriers stored by the at least one local region while the temperature of the semiconductor substrate is above 250° C.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
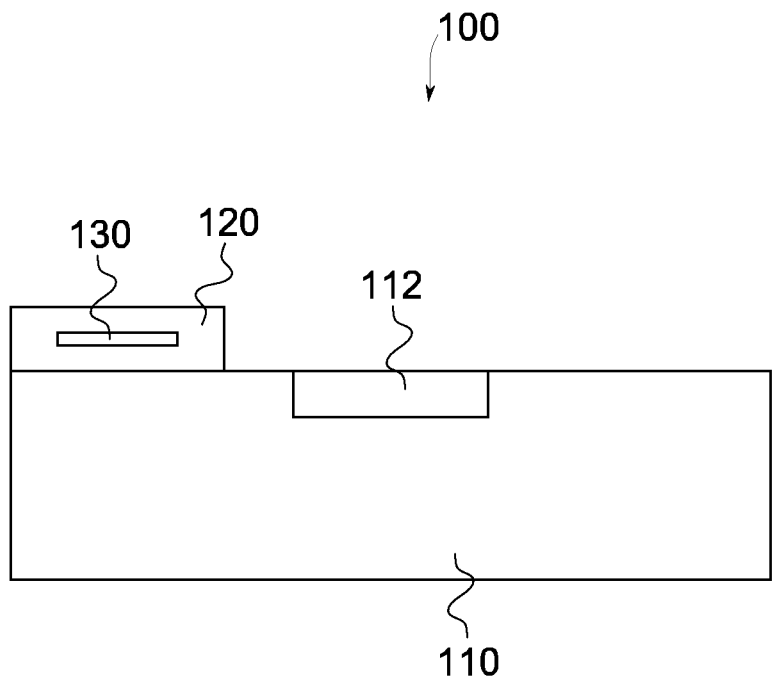
FIG. 1 shows a schematic cross section of a part of a power semiconductor device.

FIG. 1 shows a power semiconductor device 100 according to an embodiment. The power semiconductor device 100 comprises a semiconductor substrate 110 comprising at least one electrical structure 112. The at least one electrical structure 112 has a blocking voltage of more than 20V. Further, the power semiconductor device 100 comprises an electrically insulating layer structure 120 formed over at least a portion of a lateral surface of the semiconductor substrate 110. The electrically insulating layer structure 120 embeds one or more local regions 130 for storing charge carriers. Further, the one or more local regions 130 comprise in at least one direction a dimension of less than 200 nm.

The one or more local regions 130 for storing charge carriers can store charge carriers. Electrical fields occurring during operation of the power semiconductor device may be reduced or at least partly shielded due to the charge carriers stored by the one or more local regions 130 for storing charge carriers, for example. Consequently, a maximal electric field occurring at an interface between the electrically insulating layer structure 120 and a passivation layer or the electrically insulating layer structure 120 and a molding material of a package of power the semiconductor device 100 may be reduced, for example. Further, outer fields may be at least partly shielded inwards. In this way, the reliability and/or durability of semiconductor devices may be improved.

A local region 130 for storing charge carriers may be a region enclosed by the electrically insulating layer structure 120 and capable of holding charge carriers under normal operating temperatures although electric fields may occur or may exist at the position of the local region 130. For example, the one or more local regions 130 for storing charge carriers may be electrically floating regions within the electrically insulating layer structure 120. The electrically insulating layer structure 120 may completely enclose each of the one or more local regions 130. For example, the one or more local regions 130 are enclosed without an electrical connection to an electrode structure (e.g. source, drain, gate, anode or cathode) providing a reference potential during operation of the power semiconductor device 100.

The one or more local regions 130 for storing charge carriers may be implemented in various ways. For example, the electrically insulating layer structure 120 may embed a plurality of local regions 130 for storing charge carriers. The local regions 130 may be particles (e.g. semiconductor or metal particles), nano-particles (e.g. semiconductor or metal nano-particles), nano-crystals (e.g. semiconductor or metal nano-crystals), segregation regions of incorporated ions, defect cluster regions or regions of embedded charge carriers. In these examples, the local regions may comprise a dimension of less than 200 nm in all directions. In other words, a maximal dimension of each local region 130 of the plurality of local regions may be less than 200 nm (or less than 100 nm, less than 50 nm, less than 20 nm or less than 10 nm). For example, nano-particles or nano-crystals (e.g. silicon nano-crystals or germanium nano-crystals) may comprise a maximal dimension of less than 20 nm (or less than 10 nm).

The plurality of local regions 130 may be distributed over a portion of the electrically insulating layer structure 120 comprising a thickness (vertical dimension) of more than 50 nm (or more than 100 nm, more than 200 nm, more than 500 nm, more than 1 μm or more than 3 μm or between 50 nm and 3 μm). Additionally, the plurality of local regions may be distributed laterally over more than 10 μm (or more than 20 μm, more than 50 μm or more than 100 μm). For example, a density per area of local regions 130 of the plurality of local regions within at least a portion of the electrically insulating layer structure is larger than $1*10^9$ local regions per cm² (or more than $1*10^{10}$ local regions per cm² or more than $1*10^{11}$ local regions per cm²). For example, a density per volume of local regions 130 of the plurality of local regions within at least a portion of the electrically insulating layer structure is larger than $1*10^{13}$ local regions per cm³ (or more than $1*10^{14}$ local regions per cm³ or more than $1*10^{15}$ local regions per cm³.

Alternatively, a local region 130 for storing charge carriers may comprise a vertical dimension of less than 200 nm (or less than 100 nm, less than 50 nm, less than 20 nm or less than 10 nm) and a lateral extension larger than 200 nm (e.g. larger than 1 µm, larger than 5 µm, larger than 10 µm, larger than 20 µm or larger than 50 µm) in one lateral direction in parallel to the surface of the semiconductor substrate 110 resulting in a line-shaped local region or a lateral extension larger than 200 nm (e.g. larger than 1 µm, larger than 5 µm, larger than 10 µm, larger than 20 µm or larger than 50 µm) in two orthogonal lateral directions resulting in a sheet-shaped or layer-shaped local region. A charge carrier movement within a layer-shaped local region or a line-shaped local region may be possible, if a sufficiently high electric field and/or temperature occurs. For example, a single layer-shaped local region 130 or a plurality of line-shaped local regions arranged in parallel to each other may be sufficient to reduce or at least partly shield occurring electrical fields. In another example, a plurality of layer-shaped local regions 130 may be vertically stacked above the semiconductor substrate and may be separated by electrically insulating layers so that the electrically insulating layer structure 120 comprises an alternating sequence of electrically insulating layers and layer-shaped local regions 130.

Instead of one large local region 130, a plurality of local regions 130 may be arranged with a large vertical distance (e.g. more than 50 nm, more than 100 nm or more than 200 nm) to the semiconductor substrate 110 and/or another plurality of local regions and with a short lateral distance (e.g. less than 20 nm or less than 10 nm) to neighboring local regions of the plurality of local regions. A charge transfer between neighboring local regions 130 of the plurality of local regions 130 may be possible due to the short lateral distance, if a sufficiently high electric field and/or temperature occurs. In comparison, a charge transfer between the plurality of local regions 130 and the semiconductor substrate and/or the other plurality of local regions may be suppressed or prevented due to the large vertical distance although high electrical fields may occur. For example, an average distance of each local region 130 of the plurality of local regions to the closest neighboring local region 130 of the plurality of local regions is less than 10% (or less than 5% or less than 1%) of an average distance of the local regions 130 of the plurality of local regions to the surface of the semiconductor substrate 110.

A charge transfer between neighboring local regions 130 may be acceptable while a current of charge carriers from the one or more local regions 130 to the semiconductor substrate 110 (e.g. directly or through an electrically conductive structure connected to the semiconductor substrate) may be avoided, for example. For example, a current of charge carriers per area (e.g. $cm^{-2}$) from the one or more local regions 130 to the semiconductor substrate 110 may be less than $1*10^{-17}$ $A/cm^2$ (or less than $5*10^{-18}$ $A/cm^2$ or less than $1*10^{-18}$ $A/cm^2$) during normal operation of the power semiconductor device 100. For example, a current of less than $1*10^{-17}$ $A/cm^2$ corresponds to a change of $<5*10^{10}$ elementary charges per $cm^2$ in 20 years. For example, a current of charge carriers from the one or more local regions 130 to the semiconductor substrate 110 summed over an average lifetime of the power semiconductor device 100 may be less than 20% (or less than 10% or less than 5%) of the overall charge carries stored by the one or more local regions 130, if operated under normal operating conditions. In some examples, a charge transfer between local regions 130 of the plurality of local regions during normal operation (e.g. under normal operating conditions, for example, summarized in the data sheet of the power semiconductor device) of the semiconductor device may be 1000 times (or 100 times or 10000 times) larger than a current of charge carriers from the plurality of local regions 130 to the semiconductor substrate 110. For example, a current of charge carriers from the one or more local regions 130 to the semiconductor substrate 110 may be suppressed or kept below a desired limit by arranging a sufficiently thick electrically insulating layer between the one or more local regions 130 and the semiconductor substrate 110 and/or an electrode structure of the power semiconductor device 100.

For example, the local regions 130 may be charged, electrical conductive regions, which do not change or hardly change the charge condition during normal operation. The electric fields of the local regions may reduce the electric field strength at the interface between the device and the molding compound by interference with the internal fields of the device, which occur in the blocking operation. Alternatively, the reliability may be improved by the additional layer (embedding the local regions) by shielding inwards outer electrical fields, which may vary over the lifetime of the device during operation slowly on a time scale of days or weeks, so that these fields does not disturb the function of the edge termination, for example. The charge carrier distribution in an overall electrically neutral layer (e.g. nano-particle layer) may be adjusted automatically, if a slow charge carrier exchange between conductive regions (local regions, e.g. nano-particles) by tunneling processes is enabled, for example. A shielding layer (e.g. comprising a lateral dense matrix of nano-particles, for example, nano-crystals) with (low) lateral conductivity (due to tunneling) may be implemented. For example, the conductivity in some regions (e.g. which comprise nano-particles) of the layer may be strongly increased so that also fast variations of the field may be shielded during the operation.

The electrically insulating layer structure 120 may comprise one or more electrically insulating layers. At least one electrically insulating layer of the electrically insulating layer structure 120 embeds at least one local region 130 for storing charge carriers. For example, the electrically insulating layer structure 120 comprises a silicon oxide layer, a silicon nitride layer, an aluminum oxide layer or a polymer layer embedding the at least one local region 130. For example, the electrically insulating layer structure 120 comprises a silicon oxide layer embedding particles, nano-particles, nano-crystals, metal particles, segregation regions of incorporated ions, defect cluster regions or regions of embedded charge carriers. Alternatively or additionally, the electrically insulating layer structure 120 comprises an aluminum oxide layer embedding regions of embedded charge carriers. Further alternatively or additionally, the electrically insulating layer structure 120 comprises a polymer layer embedding metal particles, for example.

For example, the plurality of local regions 130 may be substantially evenly distributed over the electrically insulating layer structure 120 or the electrically insulating layer structure comprises sub-portions comprising each a substantially evenly distribution of local regions 130 of the plurality of local regions. The local regions 130 of the plurality of local regions may be substantially evenly distributed, if a local density of local regions per volume may vary by less than 10% (or less than 20% or less than 5%) of an average density of local regions per volume within the electrically insulating layer structure 120 or sub-portions of the electrically insulating layer structure 120.

For example, at least a portion of the electrically insulating layer structure 120 may embed an average amount of charge carriers per volume of more than $1*10^{10}$ elementary charges per $cm^2$ (or more than $1*10^{11}$ or more than $5*10^{11}$)

or more than $1*10^{-9}$ Coulomb per $cm^3$ (or more than $1*10^{-8}$ or more than $5*10^{-8}$) stored by the one or more local regions 130 for storing charge carriers. The one or more local regions 130 may store significantly more charge than a number of charge carriers normally incorporated into an insulating layer during manufacturing or operation of the device.

For example, the charge carriers stored by the one or more local regions 130 embedded within the electrically insulating layer structure 120 may cause an electric field of more than $1*10^5$ volts per meter (or more than $1*10^6$ V/m or more than $1*10^7$ V/m) at an interface between the electrically insulating layer structure 120 and a passivation layer or the electrically insulating layer structure 120 and a molding material of a package of the semiconductor device 100 in a non-operating state of the semiconductor device 100. The non-operating state may be a state of the power semiconductor device 100 in which no external potentials (e.g. all interfaces to external devices are electrically floating) or potential differences (e.g. all interfaces to external devices are at the same reference potential) are provided to the power semiconductor device 100 (e.g. the power semiconductor device is disconnected or isolated from other devices or the power semiconductor device is connected to one or more external devices, but the connections are inactive). In absence of external potentials, the stored charge carriers may still generate a field, which exists at an interface between the electrically insulating layer structure 120 and a passivation layer or the electrically insulating layer structure 120 and a molding material of a package of the semiconductor device 100 in a non-operating state of the semiconductor device 100. The field generated by the stored charge carriers may compensate at least a part of the electric fields occurring during operation of the device 100. In this way, maximal electric fields occurring during operation of the semiconductor device 100 may be lower than without the charge carriers stored by the one or more local regions 130.

For example, a number of charge carriers stored by the one or more local regions for storing charge carriers embedded within the electrically insulating layer structure may comprise lateral variations of an average charge per volume (e.g. a maximal number of charge carriers stored at a lateral area of 100 nm×100 nm of the electrically insulating layer structure may be at least 10% larger than an average number of charge carriers stored at another lateral area of 100 nm×100 nm of the electrically insulating layer structure). For example, the capacitance of the charge carriers stored at the one or more local regions 130 may be large enough to correspond to an (maximal) electric field occurring during operation of the semiconductor device 100. The electrical fields occurring during operation of the semiconductor device 100 may vary along the surface of the semiconductor substrate 110. Optionally, also the number of stored charge carriers may laterally vary to match a laterally varying electrical field. For example, an average number of charge carriers stored by the one or more local regions 130 embedded within the electrically insulating layer structure 120 close to (in proximity or closest to) a region of the surface of the semiconductor substrate 110 comprising a higher electric field (e.g. higher than an average or reference electric field) may be larger than an average number of charge carriers stored by the one or more local regions embedded within the electrically insulating layer structure close to (in proximity or closest to) a region of the surface of the semiconductor substrate 110 comprising a lower electric field (e.g. lower than the average or reference electric field) in a blocking state of the semiconductor device 100. In this way, a compensation of electrical fields occurring during operation of the semiconductor device 100 may be improved in comparison to a substantially laterally evenly distributed charge carriers.

The electrically insulating layer structure 120 may be arranged directly adjacent to the lateral surface (e.g. front side surface) of the semiconductor substrate 110 or one or more other layers may be arranged between the electrically insulating layer structure 120 and the semiconductor substrate 110. For example, an inorganic insulation layer (e.g. silicon oxide layer or silicon nitride layer) and/or an electrode structure (e.g. drain metal structure, source metal structure, gate metal structure, anode metal structure or cathode metal structure) may be arranged between the electrically insulating layer structure 120 and the semiconductor substrate 110. The electrically insulating layer structure 120 may extend substantially in parallel to the lateral surface of the semiconductor substrate 110 and may comprise a lateral extension significantly larger (more than 100 times larger or more than 1000 times or more than 10000 times) than a vertical dimension (thickness).

For example, the electrically insulating layer structure 120 may be arranged at an edge termination region of a power semiconductor device 100 or a region of high electric fields on the semiconductor substrate 110. For example, the electrically insulating layer structure 120 may extend at least along an edge termination region of the semiconductor substrate 110 of the power semiconductor device 100. The edge termination region may be a part of the semiconductor substrate 110 laterally extending from an edge of the semiconductor substrate 110 towards or to an active region or cell region of the semiconductor substrate 110. The cell region or active region of the semiconductor substrate may be located at a center portion of the semiconductor substrate 110. For example, a current flow through the power semiconductor device 100 may mainly (e.g. more than 90% of an overall current) occur at the cell region of the power semiconductor device 100 during operation of the power semiconductor device 100. For example, the at least one electrical structure 112 is located in the cell region or active region of the semiconductor substrate 110. The edge termination region may be used for laterally blocking a potential difference between the edge of the semiconductor substrate 110 and the cell region. High electric fields may occur within the edge termination region during operation of the power semiconductor device 100. The electrically insulating layer structure 120 with the embedded one or more local regions 130 may reduce the field at an interface towards a passivation layer or molding compound. Further, outer fields may be at least partly shielded inwards.

The lateral surface (e.g. front side surface) of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the surface of the semiconductor substrate may be a basically horizontal surface extending laterally. The surface of the semiconductor substrate may be a basically even plane (e.g. neglecting unevenness of the semiconductor structure due to the manufacturing process or trenches). For example, the front side surface of the semiconductor substrate may be the interface between the semiconductor material and an insulation layer, metal layer or passivation layer on top of the semiconductor substrate. For example, more complex structures may be located at the front side surface of the semiconductor substrate than at the back side of the semiconductor substrate. A back side surface of the semiconductor substrate may be a side or surface of the semiconductor substrate at which a back side metallization contact structure (e.g. a source/drain or collector/emitter or anode/cathode contact structure) covering more than 50% (or e.g. more than 80%) of the back side surface of the semiconductor substrate may be formed (or is formed).

A vertical direction or vertical dimension may be perpendicular or orthogonal to a front side surface of the semiconductor substrate 110 and a lateral direction or lateral dimension may be substantially in parallel to a front side surface of the semiconductor substrate 110, for example.

The semiconductor substrate 110 may be a semiconductor wafer, a part of a semiconductor wafer or a semiconductor die. The semiconductor substrate may be a silicon-based substrate (e.g. a silicon (Si) substrate or silicon wafer). Alternatively, the semiconductor substrate of the semiconductor device may be a silicon carbide (SiC) substrate, a gallium arsenide (GaAs) substrate or a gallium nitride (GaN) substrate, for example. The semiconductor substrate may be a hetero- or homo-epitaxial semiconductor substrate, a Czochralski (CZ) semiconductor substrate, a magnetic CZ semiconductor substrate, or a float zone semiconductor substrate, for example.

For example, a power semiconductor device 100 may be any semiconductor device able to handle or block voltages higher than normal CMOS (Complementary metal-oxide-semiconductor) devices. For example, the power semiconductor device 100 may be capable of blocking a voltage higher than 20V. For example, the power semiconductor device 100 or at least the at least one electrical structure 112 (e.g. vertical diode structure, vertical field effect transistor structure or a vertical insulated gate bipolar transistor structure) of the power semiconductor device may have a breakdown voltage or blocking voltage of more than more than 20V (e.g. a breakdown voltage of 20 V or 50V), more than 100 V (e.g. a breakdown voltage of 200 V, 300 V, 400V or 500V), more than 500 V (e.g. a breakdown voltage of 600 V, 700 V, 800V or 1000V) or more than 1000 V (e.g. a breakdown voltage of 1200 V, 1500 V, 1700V, 2000V, 300V or 6500V). The power semiconductor device 100 may include or may be a metal oxide semiconductor field effect transistor (MOSFET), an insulated gate bipolar transistor (IGBT), a junction field effect transistor (JFET), or a diode, for example.

Figure 2:
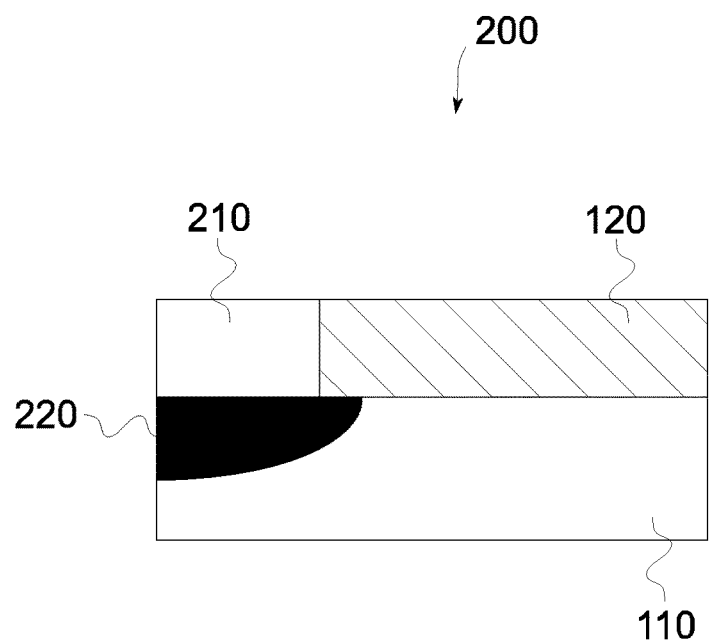
FIG. 2 shows a schematic cross section of an edge region of a semiconductor diode.

FIG. 2 shows a schematic cross section of an edge region of a semiconductor diode 200 according to an embodiment. The semiconductor diode 200 comprises a semiconductor substrate 110 (e.g. silicon bulk) with an anode/cathode region 220 (e.g. p-doped silicon anode region). Further, the semiconductor diode 200 comprises an anode/cathode electrode structure 210 (e.g. metal or poly silicon structure) located (directly) adjacent to or connected to the anode/cathode region 220 at the surface of the semiconductor substrate 110. Additionally, an electrically insulating layer structure 120 embedding a plurality of nano-crystals for storing charge carriers is located along the surface of the semiconductor substrate 110 between an edge or the semiconductor substrate 110 and the anode/cathode electrode structure 210. For example, the nano-crystals may be arranged in an oxide matrix. Alternatively, one of the other examples regarding the implementation of the electrically insulating layer structure 120 and the local regions 130 may be used.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-12).

Figure 3:
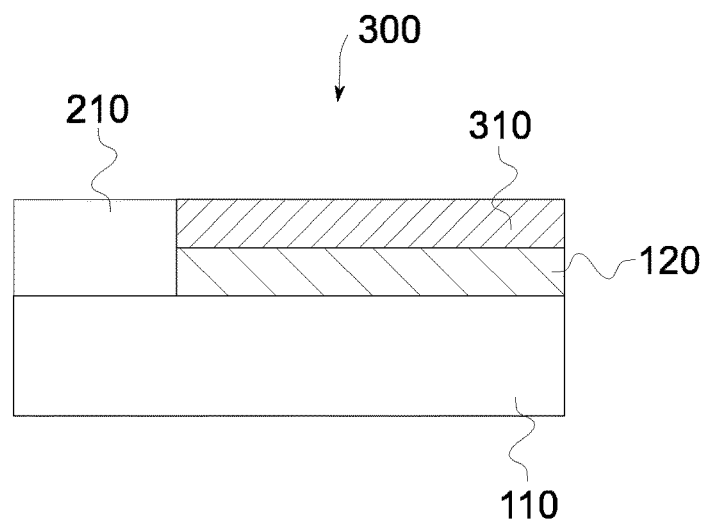
FIGS. 3-6 show schematic cross sections of edge regions of semiconductor devices.

FIG. 3 shows a schematic cross section of an edge region of a semiconductor device 300 according to an embodiment. The semiconductor device 300 comprises a semiconductor substrate 110 and an electrode structure 210 located at the surface of the semiconductor substrate 110 (direct) adjacent to at least one electrical structure located in the semiconductor substrate 110. Additionally, an electrically insulating layer structure 120 embedding a plurality of nano-crystals for storing charge carriers is located along the surface of the semiconductor substrate 110 between an edge or the semiconductor substrate 110 and the electrode structure 210. The electrically insulating layer structure 120 is covered by an inorganic electrically insulating layer 310 (e.g. silicon oxide layer).

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1-2) or below (e.g. FIGS. 4-12).

Figure 4:
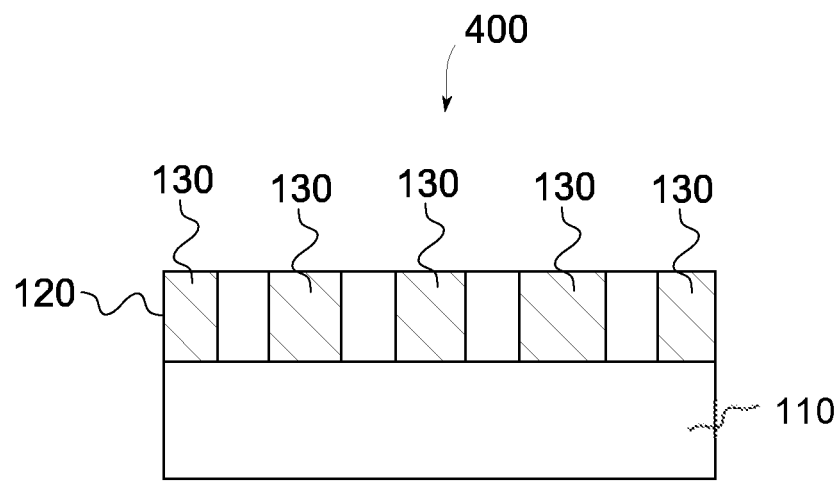

FIG. 4 shows a schematic cross section of an edge region of a semiconductor device 400 according to an embodiment. The semiconductor device 400 comprises a semiconductor substrate 110. Additionally, an electrically insulating layer structure 120 comprising a plurality of portions, each embedding a plurality of nano-crystals 130 for storing charge carriers, is located along the surface of the semiconductor substrate 110. Further, the electrically insulating layer structure 120 comprises portions without nano-crystals separating the portions with nano-crystals from each other. For example, the portions embedding nano-crystals comprise a lateral dimension of more than 1 μm (or more than 2 μm, more than 5 μm or more than 10 μm) and the portions without nano-crystals comprise a lateral dimension of more than 1 μm (or more than 2 μm, more than 5 μm or more than 10 μm).

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIG. 1-3) or below (e.g. FIGS. 5-12).

Figure 5:
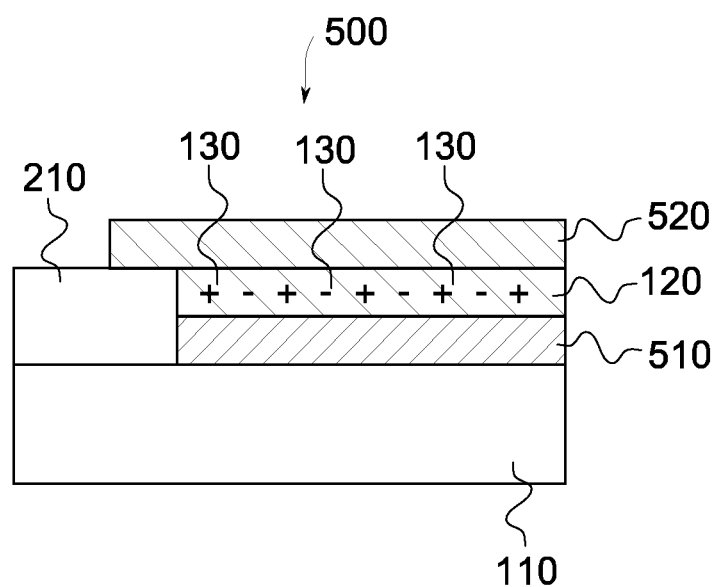

FIG. 5 shows a schematic cross section of an edge region of a semiconductor device 500 according to an embodiment. The semiconductor device 500 comprises a semiconductor substrate 110 and an electrode structure 210 located at the surface of the semiconductor substrate 110 (directly) adjacent to at least one electrical structure located in the semiconductor substrate 110. Additionally, an inorganic electrically insulating layer 510 (e.g. silicon oxide layer) is located along the surface of the semiconductor substrate 110 between an edge of the semiconductor substrate 110 and the electrode structure 210. Further, an electrically insulating layer structure 120 embedding a plurality of local regions 130 for storing charge carriers is located (directly) adjacent to the inorganic electrically insulating layer 510. The plurality of local regions 130 are charged laterally alternatingly by different charge carrier types (electrons/negative ions or positive ions/holes). For example, a group of first sub regions of the electrically insulating layer structure 120 comprises mainly local regions (e.g. more than 70% of the local regions of the first sub regions) with positive charge (e.g. majority of holes or ions) and a group of second sub regions of the electrically insulating layer structure 120 comprises mainly local regions (e.g. more than 70% of the local regions of the second sub regions) with negative charge (e.g. majority of electrons). The electrically insulating layer structure 120 is covered by a passivation layer 520 (e.g. poly imide). The different charge carriers may be generated at or moved to or from the different sub regions by selective local illumination or scanning over the surface of the electrically insulating layer structure 120 with a tip during applying different voltages to the tip and/or applying a temperature above normal operation temperature, for example.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4) or below (e.g. FIGS. 6-12).

Figure 6:
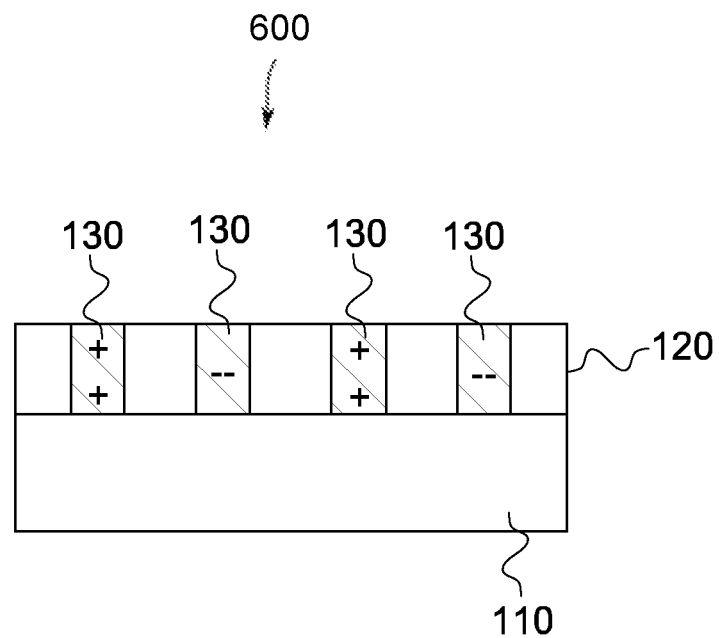

FIG. 6 shows a schematic cross section of an edge region of a semiconductor device 600 according to an embodiment. The implementation of the semiconductor device 600 is similar to the implementation shown in FIG. 4. In the example of FIG. 6, the portions of the electrically insulating layer structure 120 embedding nano-crystals comprise a group of first portions comprising mainly nano-crystals (e.g. more than 70% of the nano-crystals of the portions) with positive charge (e.g. majority of holes or ions) and a group of second portions comprising mainly nano-crystals (e.g. more than 70% of the nano-crystals of the portions) with negative charge (e.g. majority of electrons). The different charge carriers may be generated at or moved to or from the different portions by selective local illumination or scanning over the surface of the electrically insulating layer structure 120 with a tip during applying different voltages to the tip, for example. Optionally, some or all of the portions without nano-crystals may be omitted so that portions of negative and positive charge may be located adjacent to each other.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIG. 1-5) or below (e.g. FIGS. 7-12).

Figure 7:
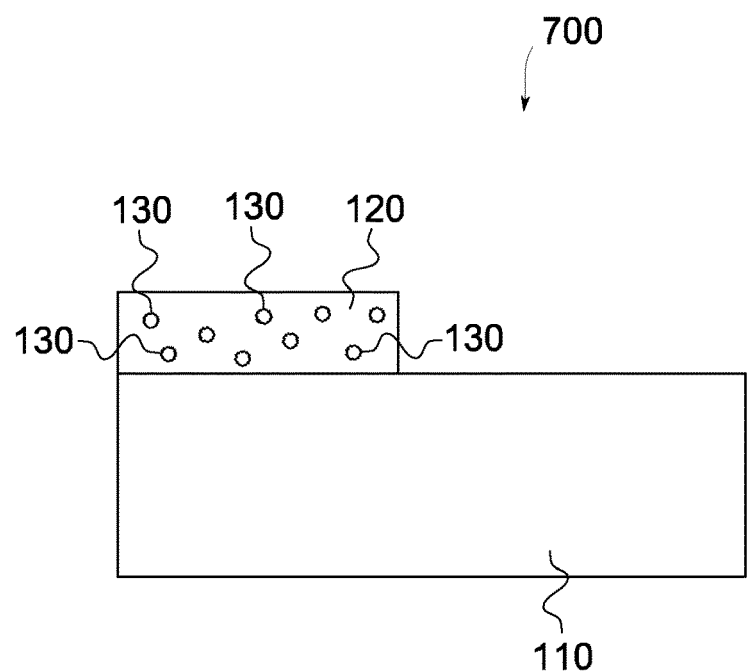
FIG. 7 shows a schematic cross section of a part of a semiconductor device with a plurality of local regions for storing charge carriers.

FIG. 7 shows a schematic cross section of a semiconductor device 700 according to an embodiment. The semiconductor device 700 comprises a semiconductor substrate 110 and an electrically insulating layer structure 120 formed over at least a portion of a lateral surface of the semiconductor substrate 110. The electrically insulating layer structure 120 embeds a plurality of local regions 130 for storing charge carriers. The plurality of local regions 130 for storing charge carriers is distributed over at least a portion of the electrically insulating layer structure 120 comprising a thickness of more than 50 nm.

The plurality of local regions 130 for storing charge carriers can store charge carriers. Electrical fields occurring during operation of the semiconductor device 700 may be reduced or at least partly shielded due to the charge carriers stored by the one or more local regions 130 for storing charge carriers, for example. Consequently, a maximal electric field occurring at an interface between the electrically insulating layer structure 120 and a passivation layer or the electrically insulating layer structure 120 and a molding material of a package of the semiconductor device 700 may be reduced, for example.

The plurality of local regions 130 are distributed over a region with a thickness of more than 50 nm (or more than 100 nm, more than 200 nm, more than 500 nm, more than 1 µm or more than 3 µm or between 50 nm and 3 µm). In this way, a large number of local regions can be distributed within the electrically insulating layer structure 120 and a large number of charge carriers may be stored by the plurality of local regions 130 without generating a conductive path through the plurality of local regions 130, for example. Additionally, the plurality of local regions may be distributed laterally over more than 10 µm (or more than 20 µm, more than 50 µm or more than 100 µm).

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIGS. 8-12).

Figure 8:
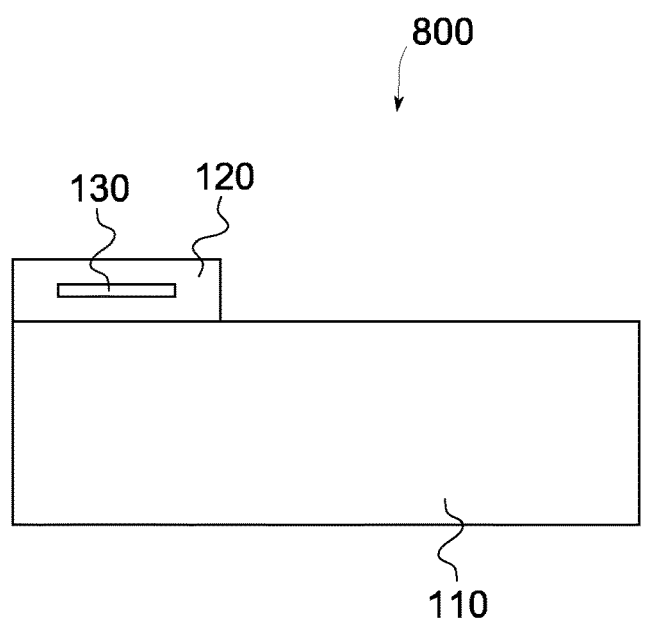
FIG. 8 shows a schematic cross section of a part of a semiconductor device.

FIG. 8 shows a schematic cross section of a semiconductor device 800 according to an embodiment. The semiconductor device 800 comprises a semiconductor substrate 110 and an electrically insulating layer structure 120 formed over at least a portion of a lateral surface of the semiconductor substrate 110. The electrically insulating layer structure 120 embeds one or more local regions 130 for storing charge carriers. A current of charge carriers from the one or more local regions 130 for storing charge carriers to the semiconductor substrate 110 is less than $1*10^{-17}$ A/cm$^2$ during normal operation of the semiconductor device 800. Further, at least a portion of the electrically insulating layer structure 120 embeds an average amount of charge carriers per volume of more than $1*10^{-8}$ Coulomb per cm$^3$ stored by the one or more local regions for storing charge carriers.

Electrical fields occurring during operation of the semiconductor device 800 may be reduced or at least partly shielded due to the charge carriers stored by the one or more local regions 130 for storing charge carriers, for example. Consequently, a maximal electric field occurring at an interface between the electrically insulating layer structure 120 and a passivation layer or the electrically insulating layer structure 120 and a molding material of a package of the semiconductor device 800 may be reduced, for example.

A large amount of charge carriers may be stored by the one or more local regions 130. For example, a portion of the electrically insulating layer structure 12 embeds an average amount of charge carriers per volume of more than $1*10^{10}$ elementary charges per cm$^2$ (or more than $1*10^{11}$ or more than $5*10^{11}$) or more than $1*10^{-9}$ Coulomb per cm$^3$ (or more than $1*10^{-8}$ or more than $5*10^{-8}$) stored by the one or more local regions 130.

A charge transfer between neighboring local regions 130 may be acceptable while a current of charge carriers from the one or more local regions 130 to the semiconductor substrate 110 or an electrically conductive structure connected to the semiconductor substrate 110 may be avoided or suppressed, for example. For example, the current of charge carriers per area (e.g. cm$^{-2}$) from the one or more local regions 130 to the semiconductor substrate 110 is less than $1*10^{-17}$ A/cm$^2$ (or less than $5*10^{-18}$ A/cm$^2$ or less than $1*10^{-18}$ A/cm$^2$) during normal operation of the power semiconductor device 100. For example, a larger current may be avoided by an insulation layer between the semiconductor substrate 110 and the electrically insulating layer structure 120 or the local regions 130 may be located within the electrically insulating layer structure 120 with sufficient distance to the semiconductor substrate. A normal operation of the semiconductor device may be an operation under conditions bearable by the semiconductor device without damaging. For example, normal operating conditions may be summarized in the data sheet of the semiconductor device.

For example, a current of charge carriers from the one or more local regions 130 to the semiconductor substrate 110 may be less than 20% (or less than 10% or less than 5%) of the overall charge carries stored by the one or more local regions 130 over an average lifetime of the power semiconductor device 800, if operated under normal operating conditions (e.g. non-destructive and repeatable operation, for example, summarized in data sheet of the device).

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1-7) or below (e.g. FIGS. 9-12).

Figure 9:
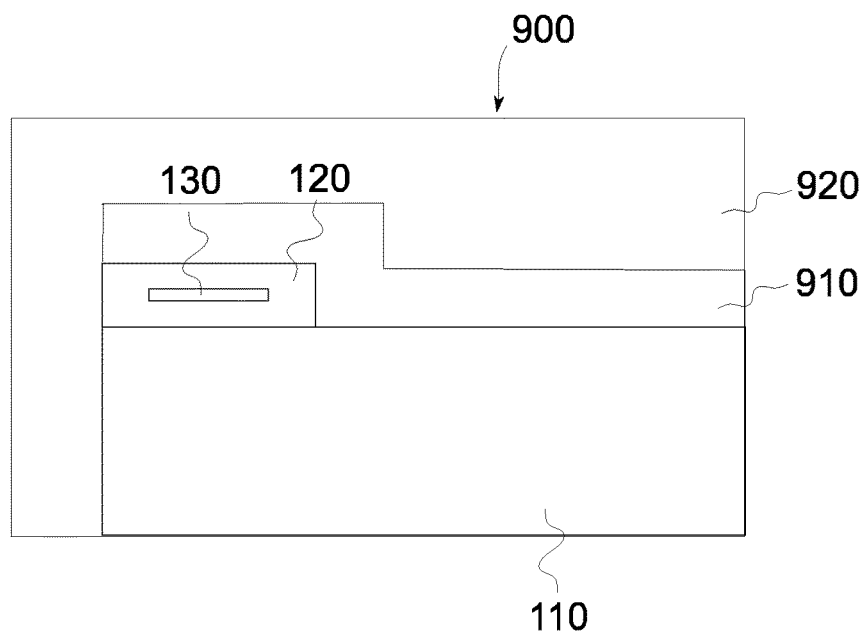
FIG. 9 shows a schematic cross section of an edge region of a semiconductor device.

FIG. 9 shows a schematic cross section of a semiconductor device 900 according to an embodiment. The semiconductor device 900 comprises a semiconductor substrate 110 and an electrically insulating layer structure 120 formed over at least a portion of a lateral surface of the semiconductor substrate 110. The electrically insulating layer structure 120 embeds one or more local regions 130 for storing charge carriers. A charge stored by the one or more local regions 130 for storing charge carriers embedded within the electrically insulating layer structure 120 causes an electric field of more than $1*10^5$ volts per meter at an interface between the electrically insulating layer structure 120 and a passivation layer 910 (e.g. one or more insulating passivation layers) or between the electrically insulating layer structure 120 and a molding material 920 (or potting gel) of a package of the semiconductor device 900 in a non-operating state of the semiconductor device 900.

Electrical fields occurring during operation of the semiconductor device 900 may be reduced or at least partly shielded due to the charge carriers stored by the one or more local regions 130 for storing charge carriers, for example. Consequently, a maximal electric field occurring at an interface between the electrically insulating layer structure 120 and a passivation layer or the electrically insulating layer structure 120 and a molding material of a package of the semiconductor device 900 may be reduced, for example.

For example, the charge carriers stored by the one or more local regions 130 embedded within the electrically insulating layer structure 120 cause an electric field of more than $1*10^5$ volts per meter (or more than $1*10^6$ V/m or more than $1*10^7$ V/m) at (at least one point or a portion of) an interface between the electrically insulating layer structure 120 and a passivation layer 910 (e.g. organic passivation layer, for example, poly imide) or the electrically insulating layer structure 120 and a molding material 920 of a package of the semiconductor device 900 in a non-operating state of the semiconductor device 900. The non-operating state may be a state of the power semiconductor device 900 in which no external potentials (e.g. all interfaces to external devices are electrically floating) or potential differences (e.g. all interfaces to external devices are at the same reference potential) are provided to the power semiconductor device 900 (e.g. the power semiconductor device is disconnected or isolated from other devices or the power semiconductor device is connected to one or more external devices, but the connections are inactive). The field generated by the stored charge carriers may compensate at least a part of the electric fields occurring during operation of the device 900.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIG. 1-8) or below (e.g. FIGS. 10-12).

Figure 10:
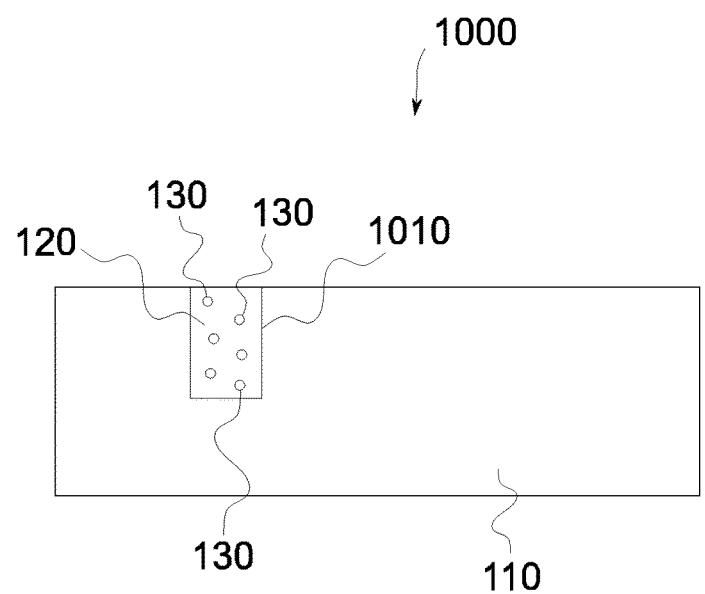
FIG. 10 shows a schematic cross section of a semiconductor device with a plurality of local regions for storing charge carriers within a trench.

FIG. 10 shows a schematic cross section of a semiconductor device 1000 according to an embodiment. The semiconductor device 1000 comprises a semiconductor substrate 110 and at least on trench 1010 extending from a surface of the semiconductor substrate 110 into the semiconductor substrate 110. Further, the semiconductor device 1000 comprises an electrically insulating layer structure 120 formed within the at least one trench 1010. The electrically insulating layer structure 120 embeds a plurality of local regions 130 for storing charge carriers. A density of local regions 130 of the plurality of local regions within at least a portion of the electrically insulating layer structure 120 is larger than $1*10^9$ local regions per $cm^2$.

Electrical fields occurring during operation of the semiconductor device 900 may be reduced or at least partly shielded due to the charge carriers stored by the one or more local regions 130 within the trench 1010, for example. For example, lateral dimensions of edge termination regions of semiconductor devices may be reduced by implementing proposed trenches within the edge termination regions.

The one or more trenches 1010 may be etched into the semiconductor substrate 110 and filled with the electrically insulating structure 120 embedding the plurality of local regions 130. For example, a depth of the trench is larger than 1 µm (or larger than 5 µm or larger than 10 µm) and a width of the trench is larger than 100 nm (or larger than 200 nm or larger than 500 nm) and lower than 10 (or lower than 5 µm or lower than 1 µm).

The plurality of local regions 130 is embedded in the electrically insulating layer structure 120 within the trench 1010. For example, the density of local regions 130 of the plurality of local regions averaged over the volume of the trench is larger than $1*10^{13}$ local regions per $cm^3$ (or more than $1*10^{14}$ local regions per $cm^3$ or more than $1*10^{15}$ local regions per $cm^3$.

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIG. 1-9) or below (e.g. FIGS. 11-12).

Figure 11A:
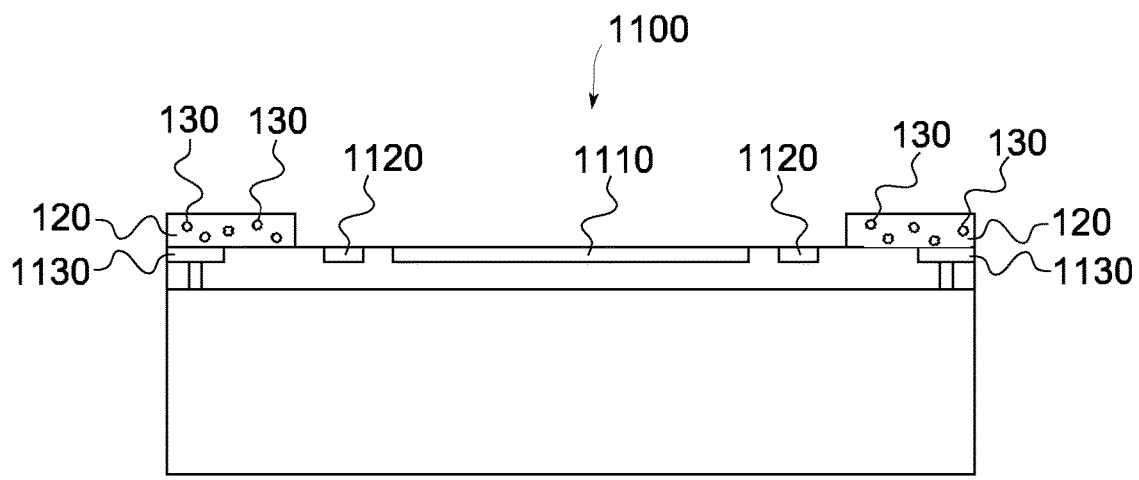
FIG. 11A shows a schematic cross section of a semiconductor device with a plurality of local regions for storing charge carriers within an edge termination region of the semiconductor device.

FIG. 11A shows a schematic cross section of a semiconductor device 1100 according to an embodiment. The semiconductor device 1100 comprises a semiconductor substrate 110 and at least one field effect transistor structure formed in the semiconductor substrate 110. A source electrode structure 1110 (e.g. metal structure) is connected to a source doping region of the at least one field effect transistor structure. Further, a gate electrode structure 1120 (e.g. gate ring laterally surrounding the source electrode structure) is connected to a gate of the at least one field effect transistor structure. Additionally, a drain electrode structure 1130 (e.g. drain ring laterally surrounding the gate ring and extending along the edge of the semiconductor substrate) is connected to an edge region of the semiconductor substrate 110.

For example, an insulation layer covers the semiconductor substrate 110 and a metal layer (e.g. copper or aluminum layer) is formed on the insulation layer to form the source electrode structure 1110, the gate electrode structure 1120 and the drain electrode structure 1130. Alternatively, the source electrode structure 1110, the gate electrode structure 1120 and the drain electrode structure 1130 are located in different metal layers separated by inter metal dielectric layers.

Further, the semiconductor device 1100 comprises an electrically insulating layer structure 120 arranged at an edge termination region of the semiconductor substrate 110. The electrically insulating layer structure 120 embeds one or more local regions 130 for storing charge carriers. The one or more local regions 130 may be implemented according to one or more examples mentioned above or below. The electrically insulating layer structure 120 may cover at least the drain electrode structure 1130. Alternatively, an insulation layer (e.g. silicon oxide) may be located between the drain electrode structure 1130 and the electrically insulating layer structure 120. The electrically insulating layer structure 120 may be covered by an inorganic insulation layer (e.g. silicon oxide or silicon nitride) or an organic passivation layer (e.g. poly imide) or may be in contact with a molding compound of the package of the semiconductor device 1100.

Figure 11B:
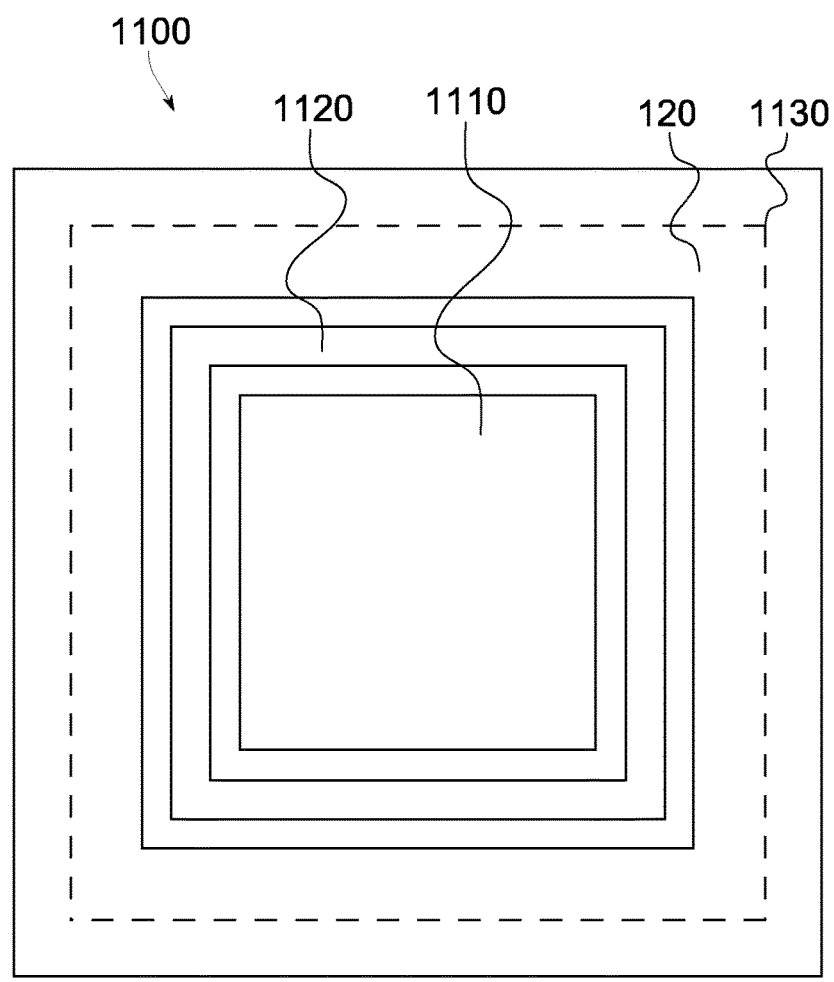
FIG. 11B shows a schematic top view of the semiconductor device shown in FIG. 11A.

FIG. 11B shows a corresponding schematic top view of the semiconductor device 1100 (without optional inorganic insulation layer, passivation layer and/or molding compound of the package). The gate electrode structure 1120 may comprise additionally an enlarged portion used as gate pad for attaching a bond wire, for example.

Optionally, a back side drain metallization may be arranged at the back side of the semiconductor substrate 110 for implementing a contact to a drain region of the at least one field effect transistor structure (e.g. vertical metal oxide semiconductor field effect transistor or insulated gate bipolar transistor).

More details and aspects are mentioned in connection with the embodiments described above or below. The embodiment shown in FIGS. 1A and 11B may comprise one or more optional additional features corresponding to one or more aspects mentioned in connection with the proposed concept or one or more embodiments described above (e.g. FIG. 1-10) or below (e.g. FIG. 12).

Figure 12:
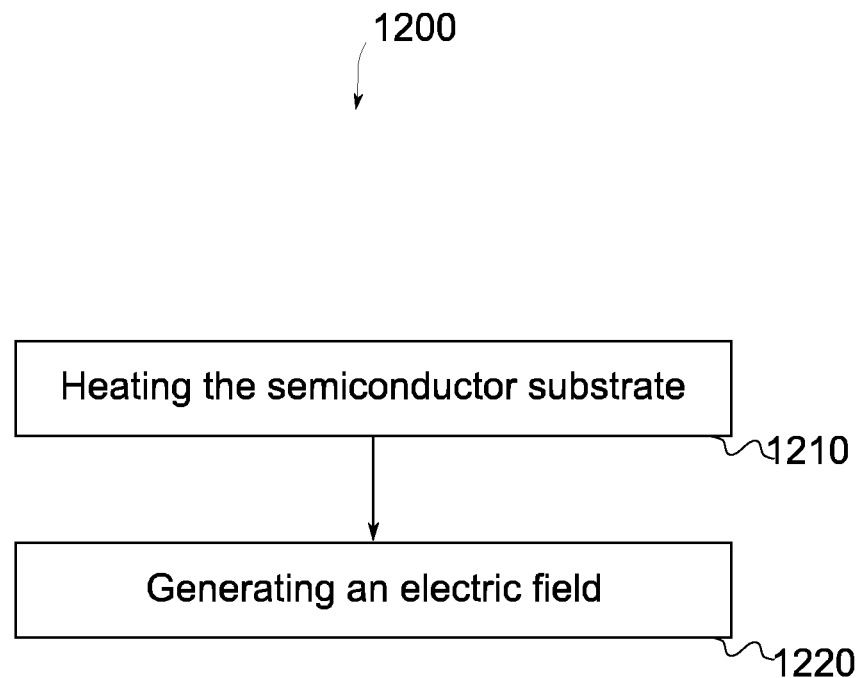
FIG. 12 shows a flow chart of a method for adjusting a number of charge carriers stored by one or more local regions for storing charge carriers.

FIG. 12 shows a flow chart of a method 1200 for adjusting a number of charge carriers stored by one or more local regions for storing charge carriers according to an embodiment. The one or more local regions for storing charge carriers are embedded within an electrically insulating layer structure formed over a semiconductor substrate of a semiconductor device. The method 1200 comprises heating 1210 the semiconductor substrate to a temperature of more than 250° C. and generating 1220 an electric field to adjust a number of charge carriers stored by the at least one local region while the temperature of the semiconductor substrate is above 250° C.

A desired number of charge carriers or a desired charge carrier distribution may be adjusted by heating the semiconductor device to a temperature above normal operating temperatures to reduce the barrier for charge carriers to move to the one or more local regions or to leave the one or more local regions. The resulting number and type (electrons or holes/ions) remaining at the one or more local regions after heating may be set by the electric field applied to the one or more local regions and the semiconductor substrate, for example.

For example, the electric field may be generated by applying voltages to the semiconductor device similar or equal to the voltages applied during normal operation of the semiconductor device. In this way, electric fields similar or equal to the electric fields occurring during operation may be generated at the one or more local regions. In contrast to normal operating conditions an increased charge transfer between the semiconductor substrate and the one or more local regions may be possible due to the high temperature, for example. For example, the charge carriers may be distributed so that fields are shielded or reduced. Alternatively, the electric field may be applied by scanning over the surface of the electrically insulating layer structure 120 with a tip during applying a constant voltage or different voltages to the tip, for example.

The semiconductor device may be externally heated (e.g. within an oven or by placing the device on a heatable carrier) to a temperature of at least 250° C. or another temperature above the normal operating temperature of the semiconductor device. For example, the normal operating temperature may be found in the data sheet of the semiconductor device. The charge carrier transfer may be accelerated by using temperatures higher than 250° C. For example, the semiconductor device may be heated to a temperature higher than 400° C. or higher than 800° C.

For example, a single programming (charge programming or preconditioning) of the local regions after manufacturing and before using the semiconductor device in a desired application may be sufficient, since the charge carrier transfer during normal operation of the semiconductor device may be significantly lower, since the temperature of the semiconductor device is significantly lower during normal operation (e.g. lower than 250° C. or lower than 200° C. or lower than 100° C.).

In another example, charge carriers may be moved to the one or more local regions or may be removed from the one or more local regions by illumination with ultra violet light and/or local heating (e.g. hot tip or laser).

The generated electrical field may be still applied during cooling the semiconductor substrate and may be removed or turned off after cooling.

More details and aspects are mentioned in connection with the embodiments described above or below. The embodiment shown in FIG. 12 may comprise one or more optional additional features corresponding to one or more aspects mentioned in connection with the proposed concept or one or more embodiments described above (e.g. FIG. 1-11) or below.

Some embodiments relate to an edge passivation with shielding effect. The proposed concept may improve the stability of high-voltage edge terminations against external influences and thus the reliability of high-voltage power semiconductor devices. For example, a passivation of the high-voltage edge termination is proposed that uses a silicon oxide layer which comprises a high density of embedded nanocrystals (NC), e.g., of silicon or germanium. Due to the local electrical conductivity of the NCs and the permanent electric charges applied thereon, the layer may have an electrical shielding effect. A continuously conductive layer may be avoided, which could increase the leakage current.

For example, the embedding oxide matrix can protect the conductive, charged nanocrystals having a shielding effect against degradation at blocking storage with moisture stress.

By selecting the density of nanocrystals in the layer, their average conductivity may be set in a large range.

The proposed structure may provide the possibility to impress a defined charge. This charge may already be incorporated during the manufacturing process of the power device. Furthermore, there is the possibility of laterally varying the impressed charge. This charge may be taken into account when designing the high-voltage edge terminal and may be used to optimize field distribution and insensitivity to external influences. Thus, the reliability of the edge termination may be enhanced and the lateral extension required for this purpose may be reduced, for example.

The characteristics of the high-voltage edges are also influenced by charges which may be present in the passivation. These charges may already emerge in the manufacturing process, or may also get there at a later stage during operation of the device in the application (e.g. from package materials or the environment).

For example, the charge sensitivity of high-voltage edge terminations may be reduced by way of a shielding layer of nanocrystals having controllable medium layer conductivity. In this respect, impression of an optimum charge state may be possible.

The layers (electrically insulating layer structure embedding local regions) described may, for example, be produced by oxidation of porous silicon, or by high-temperature tempering of suboxides or, alternatively, by laser annealing of suboxides. In case of silicon nanocrystals, the suboxide may be generated by Si implantation in $SiO_2$ or by direct (PE-) CVD deposition of $SiO_x$. By depositing $SiO_2$/SiOx multilayer structures, size and spatial distribution of nanocrystals may be set, largely independent from one another. A doping may be adjustable by deposition of phosphosilicate glass (PSG), borosilicate glass (BSG) or BPSG or gas phase doping or ion implantation or laser doping. Germanium nanocrystal layers embedded in $SiO_2$ may be produced by implantation of Ge in amorphous $SiO_2$ layers in combination with a subsequent temperature step.

Additionally, the high-voltage edge terminals may comprise field ring and/or field plate edges having a passivation comprising oxides and photo imide. High values of the electric field strength that may particularly arise at the edges of the metal field plates, including in the above passivation layers up to the surface of the imide, may be avoided by implementing the proposed concept.

Some aspects relate to nanocrystals (NC) in a range of 2 nm to 200 nm (e.g. between 5 nm and 20 nm, between 10 nm and 50 nm, between 20 nm and 100 nm or between 50 nm and 200 nm) and a doping between $1*10^{13}$ cm$^{-3}$ and $1*10^{20}$ cm$^{-3}$ and a density between $1*10^9$ cm$^{-2}$ and $1*10^{13}$ cm$^{-2}$ at a power semiconductor device (e.g. implemented by the materials Si and/or SiGe in an oxide matrix).

For example, a proposed structure may be implemented at a high voltage edge (e.g. FIG. 2). The particle size, density and/or doping (e.g. dopants and/or concentration) may be homogeneously or vertically and/or laterally varied.

A proposed structure may be arranged directly on the semiconductor surface or over an oxide or another layer (e.g. FIG. 3). Vertical or lateral structuring may be possible (e.g. FIG. 4). A proposed layer may be contacted/connected or not contacted/connected to an anode or source and/or kerf. A proposed structure may be encapsulated with programming (e.g. fixed (locally varied) charge, for example FIG. 5). A compensation principle may be implemented by structuring and doping (e.g. FIG. 6).

Some embodiments relate to the implementation of a proposed structure into a trench as trench dielectric.

Some embodiments relate to a method for forming a semiconductor device or a power semiconductor device described in connection with the proposed concept or one or more embodiments described above.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A power semiconductor device comprising:
   a semiconductor substrate comprising at least one electrical structure, wherein the at least one electrical structure has a blocking voltage of more than 20V; and
   an electrically insulating layer structure formed over at least a portion of a lateral surface of the semiconductor substrate, wherein the electrically insulating layer structure extends along an edge termination region of the semiconductor substrate,
   wherein the electrically insulating layer structure embeds a plurality of local regions configured to store charge carriers, wherein defined charge carriers are impressed in the edge termination region so that a charge carrier distribution varies laterally, wherein the plurality of local regions comprise, in at least one direction, a dimension of less than 200 nm, wherein the plurality of local regions for storing the charge carriers are at least one of the group of nano-particles and nano-crystals.

2. The power semiconductor device according to claim 1, wherein a current of the charge carriers from the plurality of local regions to the semiconductor substrate is less than $1*10^{-17}$ A/cm$^2$ during normal operation of the power semiconductor device.

3. The power semiconductor device according to claim 1, wherein the plurality of local regions are electrically floating regions within the electrically insulating layer structure.

4. The power semiconductor device according to claim 1, wherein the plurality of local regions are distributed over at least a portion of the electrically insulating layer structure comprising a thickness of more than 50 nm.

5. The power semiconductor device according to claim 1, wherein a maximal dimension of each local region of the plurality of local regions is less than 200 nm.

6. The power semiconductor device according to claim 1, wherein a density of local regions of the plurality of local regions within at least a portion of the electrically insulating layer structure is larger than $1*10^9$ local regions per cm$^2$.

7. The power semiconductor device according to claim 1, wherein a local density of local regions per volume vary by less than 10% of an average density of local regions per volume within the electrically insulating layer structure or sub-portions of the electrically insulating layer structure.

8. The power semiconductor device according to claim 1, wherein an average distance of each local region of the plurality of local regions to a closest neighboring local region of the plurality of local regions is less than 10% of an average distance of the local regions of the plurality of local regions to the lateral surface of the semiconductor substrate.

9. The power semiconductor device according to claim 1, wherein the plurality of local regions are distributed laterally over more than 10 μm.

10. The power semiconductor device according to claim 1, wherein the electrically insulating layer structure is one of the group of a silicon oxide layer, a silicon nitride layer, an aluminum oxide layer and a polymer layer.

11. The power semiconductor device according to claim 1, wherein the charge carriers stored by the plurality of local regions embedded within the electrically insulating layer structure cause an electric field of more than $1*10^5$ volts per meter at an interface between the electrically insulating layer structure and a passivation layer or between the electrically insulating layer structure and a molding material or potting gel of a package of the power semiconductor device in a non-operating state of the power semiconductor device.

12. The power semiconductor device according to claim 1, wherein a number of the charge carriers stored by the plurality of local regions embedded within the electrically insulating layer structure comprises a lateral variation of an average charge per volume.

13. The power semiconductor device according to claim 1, wherein:
    the electrically insulating layer structure embeds the plurality of local regions configured to store the charge carriers,
    the plurality of local regions are distributed over at least a portion of the electrically insulating layer structure comprising a thickness of more than 50 nm, and
    the plurality of local regions are at least one of the group of nano-particles and nano-crystals.

14. The power semiconductor device according to claim 1, wherein:
    the electrically insulating layer structure embeds the plurality of local regions configured to store the charge carriers,
    a current of the charge carriers from the plurality of local regions to the semiconductor substrate is less than $1*10^{-17}$ A/cm$^2$ during normal operation of the power semiconductor device,
    at least a portion of the electrically insulating layer structure embeds an average amount of the charge carriers per volume of more than $1*10^{-8}$ Coulomb per cm$^2$ stored by the plurality of local regions, and the plurality of local regions are at least one of the group of nano-particles and nano-crystals.

15. The power semiconductor device according to claim 1, wherein:
    the electrically insulating layer structure embeds the plurality of local regions configured to store the charge carriers,
    a charge stored by the plurality of local regions embedded within the electrically insulating layer structure causes an electric field of more than $1*10^5$ volts per meter at an interface between the electrically insulating layer structure and a passivation layer or between the electrically insulating layer structure and a molding material of a package of the semiconductor device in a non-operating state of the semiconductor device, and
    the plurality of local regions are at least one of the group of nano-particles and nano-crystals.

16. A power semiconductor device comprising:
    a semiconductor substrate comprising at least one electrical structure, wherein the at least one electrical structure has a blocking voltage of more than 20V;
    at least one trench extending from a surface of the semiconductor substrate into the semiconductor substrate; and
    an electrically insulating layer structure formed within the at least one trench, wherein the electrically insulating layer structure embeds a plurality of local regions configured to store charge carriers, wherein defined charge carriers are impressed in an edge termination region of the semiconductor substrate so that a charge carrier distribution varies laterally, wherein a density of local regions of the plurality of local regions within at least a portion of the electrically insulating layer structure is larger than $1*10^{13}$ local regions per cm$^3$, wherein the plurality of local regions for storing the charge carriers are at least one of the group of nano-particles and nano-crystals.

17. A power semiconductor device comprising:
a semiconductor substrate comprising at least one electrical structure, wherein the at least one electrical structure has a blocking voltage of more than 20V; and
an electrically insulating layer structure formed over at least a portion of a lateral surface of the semiconductor substrate, wherein the electrically insulating layer structure extends along an edge termination region of the semiconductor substrate,
wherein the electrically insulating layer structure includes a plurality of first portions and a plurality of second portions that laterally alternate on an individual basis with the plurality of first portions,
wherein each of the plurality of first portions embeds a plurality of local regions configured to store charge carriers, wherein each of the plurality of local regions comprise, in at least one direction, a dimension of less than 200 nm, wherein the plurality of local regions are at least one of the group of nano-particles and nano-crystals, and
wherein each of the plurality of second portions are void of any local regions, and each of the of the plurality of second portions is interposed between two of the plurality of first portions,
wherein the plurality of first portions are laterally alternating by different charge carrier types such that the plurality of local regions in each of a first subset of the plurality of first portions comprise a majority of local regions with a positive charge and the plurality of local regions in each of a second subset of the plurality of first portions comprise a majority of local regions with a negative charge.

18. The power semiconductor device according to claim 17, wherein the majority of local regions with the positive charge comprise at least 70% of the plurality of local regions in each of the first subset of the plurality of first portions, and the majority of local regions with the negative charge comprise at least 70% of the plurality of local regions in each of the second subset of the plurality of first portions.

* * * * *